United States Patent
Black et al.

(10) Patent No.: US 12,094,853 B2
(45) Date of Patent: Sep. 17, 2024

(54) SEMICONDUCTOR CHIP WITH REDUNDANT THRU-SILICON-VIAS

(71) Applicants: ADVANCED MICRO DEVICES, INC., Santa Clara, CA (US); ATI TECHNOLOGIES ULC, Markham (CA)

(72) Inventors: Bryan Black, Spicewood, TX (US);
Michael Z. Su, Round Rock, TX (US);
Gamal Refai-Ahmed, Markham (CA);
Joe Siegel, Boxborough, MA (US);
Seth Prejean, Austin, TX (US)

(73) Assignees: ADVANCED MICRO DEVICES, INC., Santa Clara, CA (US); ATI TECHNOLOGIES ULC, Markham (CA)

( * ) Notice: Subject to any disclaimer, the term of this patent is extended or adjusted under 35 U.S.C. 154(b) by 0 days.

(21) Appl. No.: 17/963,729

(22) Filed: Oct. 11, 2022

(65) Prior Publication Data
US 2023/0031099 A1    Feb. 2, 2023

Related U.S. Application Data

(62) Division of application No. 15/247,259, filed on Aug. 25, 2016, now Pat. No. 11,469,212, which is a
(Continued)

(51) Int. Cl.
*H01L 23/48*    (2006.01)
*H01L 23/00*    (2006.01)
*H01L 25/065*    (2023.01)

(52) U.S. Cl.
CPC ........ *H01L 25/0657* (2013.01); *H01L 23/481* (2013.01); *H01L 24/05* (2013.01);
(Continued)

(58) Field of Classification Search
CPC ... H01L 2224/0233; H01L 2224/02331; H01L 2224/0401; H01L 2224/05022;
(Continued)

(56) References Cited

U.S. PATENT DOCUMENTS

| | | |
|---|---|---|
| 4,645,546 A | 2/1987 | Matsushita |
| 2005/0064707 A1* | 3/2005 | Sinha ................ H01L 23/49827 257/E21.597 |

(Continued)

FOREIGN PATENT DOCUMENTS

| | | |
|---|---|---|
| JP | 2007194669 A | 8/2007 |
| JP | 2009295616 A | 12/2009 |

(Continued)

OTHER PUBLICATIONS

Kiegler et al., Copper Deposition for Pillars and Vias, Semiconductor Manufacturing Magazine, vol. 7, Issue 8, dated Aug. 2006, 6 pages.
(Continued)

*Primary Examiner* — Meiya Li

(57) ABSTRACT

A semiconductor chip with conductive vias and a method of manufacturing the same are disclosed. The method includes forming a first plurality of conductive vias in a layer of a first semiconductor chip The first plurality of conductive vias includes first ends and second ends. A first conductor pad is formed in ohmic contact with the first ends of the first plurality of conductive vias.

20 Claims, 6 Drawing Sheets

Related U.S. Application Data division of application No. 12/878,542, filed on Sep. 9, 2010, now Pat. No. 9,437,561.

(52) U.S. Cl.
CPC .............. *H01L 24/06* (2013.01); *H01L 24/13* (2013.01); *H01L 24/03* (2013.01); *H01L 24/11* (2013.01); *H01L 2224/0233* (2013.01); *H01L 2224/02331* (2013.01); *H01L 2224/0401* (2013.01); *H01L 2224/05022* (2013.01); *H01L 2224/05095* (2013.01); *H01L 2224/05139* (2013.01); *H01L 2224/05144* (2013.01); *H01L 2224/05147* (2013.01); *H01L 2224/05155* (2013.01); *H01L 2224/05169* (2013.01); *H01L 2224/05567* (2013.01); *H01L 2224/0557* (2013.01); *H01L 2224/05572* (2013.01); *H01L 2224/05639* (2013.01); *H01L 2224/05644* (2013.01); *H01L 2224/05647* (2013.01); *H01L 2224/05655* (2013.01); *H01L 2224/05669* (2013.01); *H01L 2224/06181* (2013.01); *H01L 2224/13022* (2013.01); *H01L 2224/13025* (2013.01); *H01L 2224/131* (2013.01); *H01L 2224/17181* (2013.01); *H01L 2225/06548* (2013.01); *H01L 2924/00014* (2013.01); *H01L 2924/01013* (2013.01); *H01L 2924/01019* (2013.01); *H01L 2924/01029* (2013.01); *H01L 2924/01032* (2013.01); *H01L 2924/01033* (2013.01); *H01L 2924/01047* (2013.01); *H01L 2924/0105* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/014* (2013.01); *H01L 2924/14* (2013.01); *H01L 2924/351* (2013.01)

(58) Field of Classification Search
CPC . H01L 2224/05095; H01L 2224/05139; H01L 2224/05144; H01L 2224/05147; H01L 2224/05155; H01L 2224/05169; H01L 2224/05552; H01L 2224/05567; H01L 2224/0557; H01L 2224/05572; H01L 2224/05639; H01L 2224/05644; H01L 2224/05647; H01L 2224/05655; H01L 2224/05669; H01L 2224/06181; H01L 2224/13022; H01L 2224/13025; H01L 2224/131; H01L 2224/17181; H01L 2225/06548; H01L 23/481; H01L 24/03; H01L 24/05; H01L 24/06; H01L 24/11; H01L 24/13; H01L 25/0657; H01L 2924/00; H01L 2924/00014; H01L 2924/01013; H01L 2924/01019; H01L 2924/01029; H01L 2924/01032; H01L 2924/01033; H01L 2924/01047; H01L 2924/0105; H01L 2924/01074; H01L 2924/01078; H01L 2924/01079; H01L 2924/01082; H01L 2924/01322; H01L 2924/014; H01L 2924/14; H01L 2924/351

See application file for complete search history.

(56) References Cited

U.S. PATENT DOCUMENTS

| | | |
|---|---|---|
| 2006/0202347 A1 | 9/2006 | Egawa |
| 2008/0136023 A1 | 6/2008 | Komai et al. |
| 2008/0237806 A1 | 10/2008 | Uchiyama |
| 2009/0261458 A1 | 10/2009 | Bae et al. |
| 2009/0294983 A1 | 12/2009 | Cobbley et al. |
| 2010/0032843 A1 | 2/2010 | Chen et al. |
| 2011/0140126 A1* | 6/2011 | Gaul .................. H01L 25/0657 257/77 |

FOREIGN PATENT DOCUMENTS

| | | |
|---|---|---|
| JP | 2010135348 A | 6/2010 |
| WO | 2007024009 A1 | 3/2007 |

OTHER PUBLICATIONS

PCT/US2011/051027 International Search Report mailed Oct. 28, 2011, 14 pages.

\* cited by examiner

SEMICONDUCTOR CHIP WITH REDUNDANT THRU-SILICON-VIAS

BACKGROUND OF THE INVENTION

1. Field of the Invention

This invention relates generally to semiconductor processing, and more particularly to semiconductor chips incorporating thru-silicon-vias and methods of fabricating the same.

2. Description of the Related Art

Some time ago semiconductor chip designers began stacking multiple semiconductor dice (aka "dies") vertically in order to obtain more functionality without an attendant increase in required package substrate or circuit board area. A variety of techniques have been used to electrically connect adjacent dice in such stacked arrangements. One technique has involved the use of wire bonds leading from contact pads on one die to corresponding contact pads on an adjacent die. Another technique that has been introduced more recently involves the use of so-called thru-silicon-vias (TSV). A typical TSV is a conductive via that extends nearly or perhaps entirely through a semiconductor chip, depending on the presence or absence of any intervening conductor pads at one or the other of the principal surfaces of the chip.

A typical conventional TSV provides electrical routing between opposite principal surfaces of a semiconductor chip. On one side, the conventional TSV is connected to some type of input/output structure (I/O), which is often a solder bump designed to form a solder joint with a package substrate during flip-chip solder reflow. The TSV is not connected directly to the solder bump, but to some intervening structure, such as an outermost metallization structure like a bump pad. The other or backside end of the TSV is connected to some form of backside I/O structure, typically through some intermediary conductor structure. The conventional TSV arrangement includes a single TSV metallurgically joined to a single bump pad.

Conventional TSVs are subjected to Joule heating and electromigration issues that vary in intensity depending on power levels, thermal management, die size and other factors. A one-to-one TSV to bump pad arrangement is subjected to such environmental considerations.

The present invention is directed to overcoming or reducing the effects of one or more of the foregoing disadvantages.

SUMMARY OF THE INVENTION

In accordance with one aspect of the present invention, a method of manufacturing is provided that includes forming a first plurality of conductive vias in a layer of a first semiconductor chip. The first plurality of conductive vias includes first ends and second ends. A first conductor pad is formed in ohmic contact with the first ends of the first plurality of conductive vias.

In accordance with another aspect of the present invention, a method of manufacturing is provided that includes forming a first plurality of conductive vias in a layer of a first semiconductor chip. The first plurality of conductive vias includes first ends and second ends. The first semiconductor chip has a first side and a second and opposite side. A first conductor is formed proximate the first side and in ohmic contact with the first ends of the first plurality of conductive vias. A second conductor is formed proximate the second side and in ohmic contact with the second ends of the first plurality of conductive vias.

In accordance with another aspect of the present invention, an apparatus is provided that includes a first semiconductor chip that has a layer and a first conductor pad coupled to the first semiconductor chip. A first plurality of conductive vias traverses the layer and has first ends and second ends. The first ends are in ohmic contact with the first conductor pad.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip device that includes two or more stacked substrates are described herein. One example includes at least one semiconductor chip with plural TSVs. However, plural TSVs are formed in ohmic contact with a given conductor structure, such as a bump or pillar pad. With redundancy in TSV-to-pad connections, failure of a given TSV need not open circuit the pad. Additional details will now be described.

Figure 1:
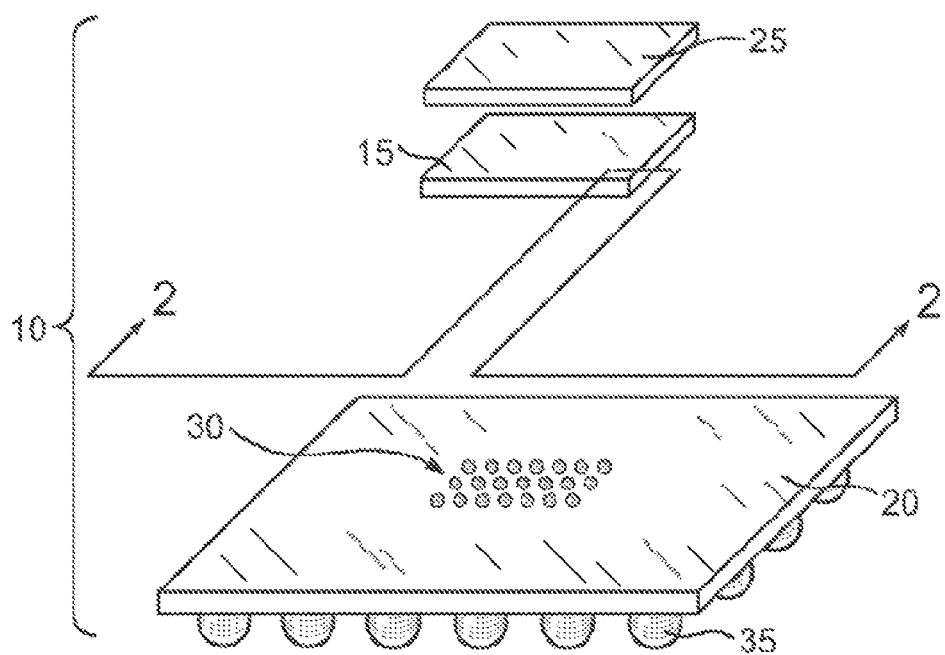
FIG. 1 is an exploded pictorial view of an exemplary embodiment of a semiconductor chip device that includes a semiconductor chip mounted on a circuit board.

In the drawings described below, reference numerals are generally repeated where identical elements appear in more than one figure. Turning now to the drawings, and in particular to FIG. 1, therein is shown an exploded pictorial view of an exemplary embodiment of a semiconductor chip device 10 that includes a semiconductor chip 15 mounted on a circuit board 20. The semiconductor chip 15 is adapted to have one or more other semiconductor chips, one of which is shown and labeled 25, mounted thereon in a stacked arrangement. The semiconductor chip 15 may interface electrically with the circuit board 20 by way of plural interconnect structures, which may be conductive pillars, solder joints or other types of interconnects. In this illustrative embodiment, the semiconductor chip 15 may interface with the circuit board 20 by way of plural solder joints which may consist of respective solder structures (not visible) of the semiconductor chip 15 which join metallurgically to corresponding solder structures 30 of the circuit board 20. The circuit board 20, may in turn, interface electrically with another electronic device, such as another circuit board or other device by way of plural input/output structures. In this illustrative embodiment, the input/output structures consist of an array of solder balls 35. However, the skilled artisan will appreciate that other types of interconnect structures, such as pin grid arrays, land grid arrays or other interconnect structures could be used as well.

The exemplary structures of the semiconductor chip 15 disclosed herein are not dependent on a particular electronic functionality. Thus, the semiconductor chip IS and the semiconductor chip 25 may be any of a myriad of different types of circuit devices used in electronics, such as, for example, microprocessors, graphics processors, combined microprocessor/graphics processors, application specific integrated circuits, memory devices, active optical devices, such as lasers, or the like, and may be single or multi-core or even stacked laterally with additional dice. Furthermore, one or both of the semiconductor chips 15 and 25 could be configured as an interposer with or without some logic circuits. Thus the term "chip" includes an interposer. The semiconductor chips 15 and 25 may be constructed of bulk semiconductor, such as silicon or germanium, or semiconductor on insulator materials, such as silicon-on-insulator materials, or other chip materials.

The exemplary structures of the semiconductor chip 15 disclosed herein are not dependent on a particular electronic circuit board functionality. Thus, the circuit board 20 may be a semiconductor chip package substrate, a circuit card, or virtually any other type of printed circuit board. Although a monolithic structure could be used for the circuit board 20, a more typical configuration will utilize a buildup design. In this regard, the circuit board 20 may consist of a central core upon which one or more buildup layers are formed and below which an additional one or more buildup layers are formed. The core itself may consist of a stack of one or more layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 is provided with a number of conductor traces and vias and other structures (not visible) in order to provide power, ground and signals transfers between the semiconductor chips 15 and 25 and another device, such as another circuit board for example. The circuit board 20 may be electrically connected to another device (not shown) by way of an input/output array such as the ball grid array depicted. The ball grid array includes the aforementioned plural solder balls 35 metallurgically bonded to respective ball pads (not shown). The ball pads (not shown) are interconnected to various conductor pads in the circuit board 20 by way of plural interconnect traces and vias and other structures that are not shown.

Figure 2:
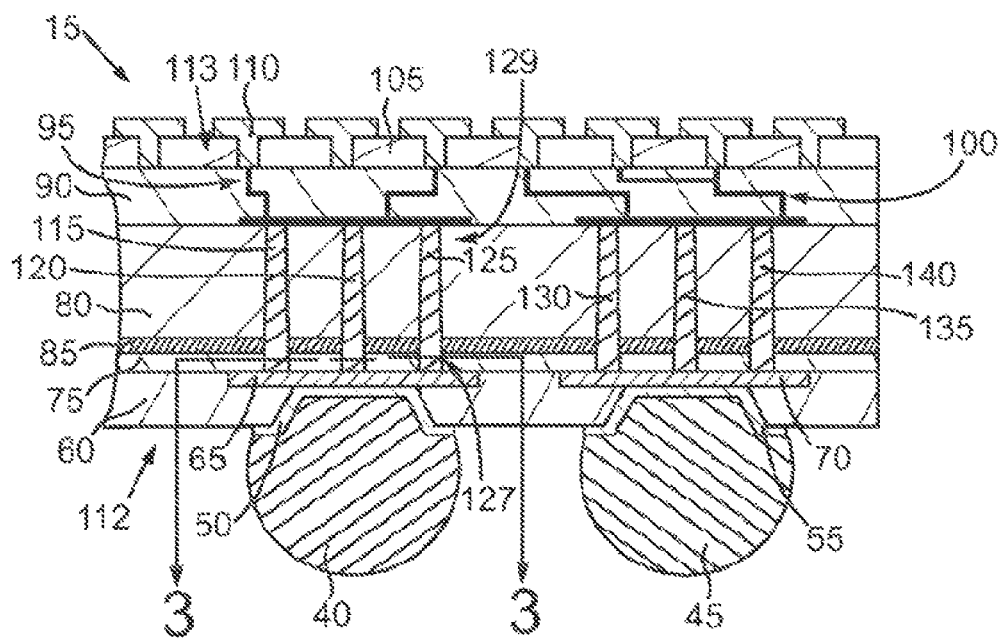
FIG. 2 is a sectional view of FIG. 1 taken at section 2-2.

Additional details of the semiconductor chip 15 will be described in conjunction with FIG. 2, which is a sectional view of FIG. 1 taken at section 2-2. Before turning to the discussion of FIG. 2, note that section 2-2 of FIG. 1 passes through a small portion of the semiconductor chip 15. With that backdrop, attention is now turned to FIG. 2. As noted briefly above, the semiconductor chip 15 may include plural input/output structures that are designed to join metallurgically with the interconnect structures 30 of the circuit board 20. A couple of these exemplary interconnect structures may consist of respective solder bumps 40 and 45. The solder bumps 40 and 45 may be composed of various types of solders, such as lead-free or lead-based solders. Examples of suitable lead-free solders include tin-silver (about 97.3% Sn 2.7% Ag), tin-copper (about 99% Sn 1% Cu), tin-silver-copper (about 96.5% Sn 3% Ag 0.5% Cu) or the like. Examples of lead-based solders include tin-lead solders at or near eutectic proportions or the like. As noted above, the solder balls 40 and 45 may be replaced with conductive pillars or other types of interconnect structures as desired. Here, the solder bumps 40 and 45 are coupled to underbump metallization (UBM) structures 50 and 55, respectively. The UBM structures 50 and 55 are formed on and in a passivation structure 60, which may be a monolithic or laminate film of insulating material. The UBM structures 50 and 55 are, in turn, connected to conductor structures or pads 65 and 70. The conductor pads 65 and 70 may consist of conductor pads that actually form part of what is a metallization layer 75 that includes plural alternating layers of interlevel dielectric and metallization layers (not shown). It should be understood that FIG. 2 is somewhat schematic in nature since the conductor pads 65 and 70 and the metallization layer 75 are not shown to scale In any event, the interlevel dielectric layers (not shown) used for the metal interconnect layer 75 may consist of well-known silicon dioxide, other types of silicate glasses, low-K dielectric films or the like. The metallization structures in the layer 75 as well as the metal pads 65 and 70 and the UBM structures 50 and 55 may be composed of various conductors, such as copper, silver, nickel, platinum, gold, aluminum, palladium, alloys or laminates of these or the like. The conductor pads 65 and 70 may be formed by well-known material placement and patterning techniques, such as plating, chemical vapor deposition (CVD) or the like, and lithography with chemical etching laser ablation or the like.

The semiconductor chip 15 is a multi-strata structure in that there may be a bulk stratum or layer 80, a device stratum or layer 85 in which large numbers of transistors, capacitors and other circuit devices may be formed, and a metallization stratum or layer 75. The metallization layer 75 may be formed as a series of metallization layers sandwiched between interlevel dielectric layers that are successively built up on the device layer 85. Because the semiconductor chip 15 is designed to have another semiconductor chip, such as the semiconductor chip 25, stacked thereon, a backside metallization scheme is provided. In this regard, a redistribution layer (RDL) 90 may be formed on the semiconductor layer 80. The RDL 90 may be monolithic or a laminate structure of one or more layers of build-up or other wise deposited insulating material interwoven with one or more RDL metallization structures that may be on the same or different levels. In this illustrative embodiment, RDL metallization structures 95 and 100 are visible. The RDL 90 may be topped with an insulating or passivation layer 105 and plural input/output structures 110. The passivation layer 105 may be monolithic or a laminate of plural insulating films and may be composed of the same types of materials used for the passivation structure layer 60 described elsewhere herein. The input/output structures 110 may be conductive pillars, pads, solder joints or the like, and are used to establish electrical interfaces with the semiconductor chip 25 depicted in FIG. 2. The interconnect structures 110 may be composed of various conductors, such as copper, silver, nickel, platinum, gold, aluminum, palladium, alloys or laminates of these, solders or the like. The RDL structures 95 and 100 may connect to one or more of the interconnect structures 110.

To establish conducting pathways between opposite sides 112 and 113 of the semiconductor chip 15, and more particularly between the RDL structures 95 and 100 and the conductor pads 65 and 70, plural TSVs, three of which are visible and labeled 115, 120 and 125, may be formed in the semiconductor layer 80 to extend through the device layer 85 and the metallization layer 75 and join the RDL structure 95 to the conductor pad 65. In this way, respective ends 127 of the TSVs contact the conductor pad 65 and opposite ends 129 thereof contact the RDL structure 95. A similar plurality of TSVs 130, 135 and 140 may join the RDL structure 100 to the conductor pad 70 electrically. It should be understood that the terms "TSV" and "semiconductor" are used generically herein, in that the semiconductor layer 80 may be composed of material(s) other than silicon, and even of insulating materials such as silicon dioxide, tetra-ethyl-ortho-silicate or others. Unlike a conventional semiconductor chip design utilizing a single TSV per pad, the embodiments disclosed herein utilize plural TSVs for a given conductor pad, such as the TSVs 115, 120 and 125 and the conductor pad 65. The use of multiple TSVs for a given conductor pad provides improved spread of thermal stresses and lowers current density and thus Joule heating, which can enhance electromigration lifespan. With multiple TSVs connected to a given conductor pad, the failure of one of the TSVs due to, for example, a stress migration fracture, can be compensated for by the other remaining TSVs. The TSVs 115, 120, 125, 130, 135 and 140 may be composed of a variety of materials, such as copper, tungsten, graphene, aluminum, platinum, gold, palladium, alloys of these or like. Clad structures are envisioned.

Figure 3:
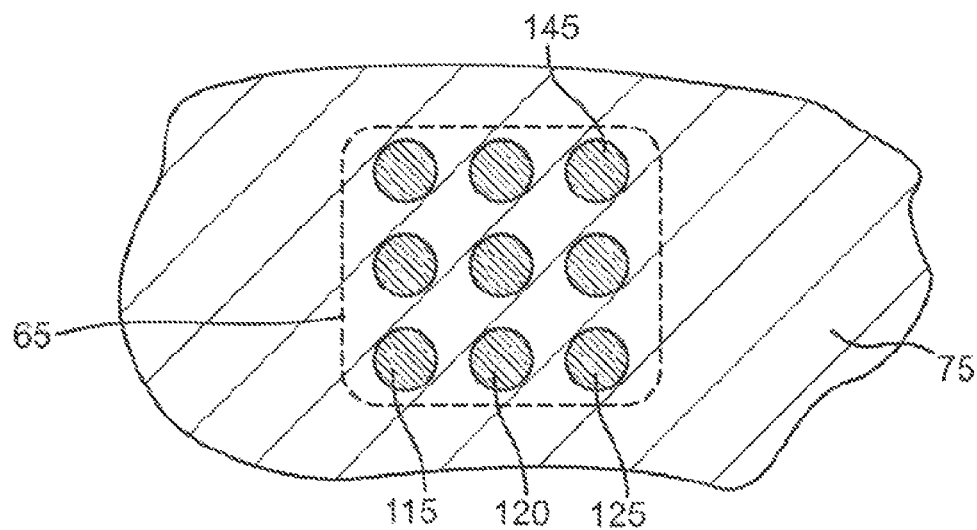
FIG. 3 is a sectional view of FIG. 2 taken at section 3-3.

Additional details of the TSVs 115, 120 and 125 may be understood by referring now to FIG. 3, which is a sectional view of FIG. 2 taken at section 3-3. Before turning to section 3-3 in earnest, it should be noted that section 3-3 passes through the TSVs 115, 120 and 125 near the conductor pad 65. Attention is now turned to FIG. 3. Note that because of the location of section 3-3, the TSVs 115, 120 and 125 appear in section but the underlying conductor pad 65 is obscured by the metallization layer 75 and thus is shown in phantom. The TSVs connected to the conductor pad 65 may be more numerous than three TSVs 115, 120 and 125 and indeed here may include six more TSVs collectively labeled 145. In this illustrative embodiment, the TSVs 115, 120, 125 and 145 may be arranged in an array that generally tracks the footprint of the underlying conductor pad 65. However, the skilled artisan will appreciate that the actual spatial arrangement of the TSVs connected to a given conductor pad may take on a variety of different shapes as can the conductor pad 65. Note also that the TSVs 115, 120, 125 and 145 may be generally monolithic in construction. However, and as described in conjunction with an alternate embodiment depicted in FIG. 4, other arrangements may be used as well.

Figure 4:
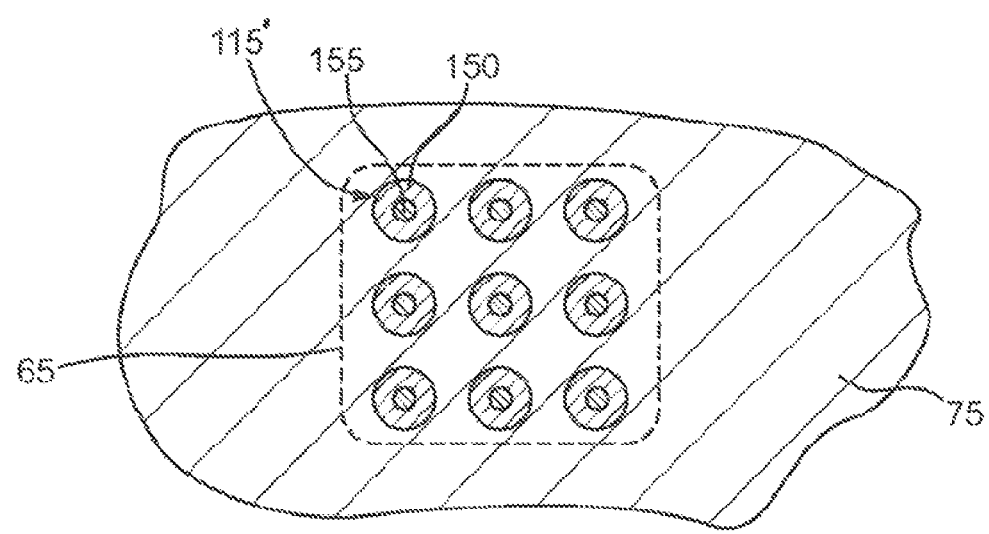
FIG. 4 is a sectional view like FIG. 3 but of an alternate exemplary embodiment of plural TSVs connected to an underlying conductor pad.

Attention is now turned to FIG. 4, which is a sectional view like FIG. 3 but of an alternate exemplary embodiment of plural TSVs 115' connected to an underlying conductor pad 65. Here, the conductor pad 65 is again shown in phantom since it is actually positioned below the metallization layer 75. As just noted, other than a monolithic arrangement may be used for a given TSV. Thus, the TSVs 115' may consist of a jacket 150 and a polymer core 155. The jacket 150 may be composed of copper, tungsten, graphene, aluminum, platinum, gold, palladium, alloys of these or like. The polymer core 155 may be composed of a variety of polymers which may be conducting or non-conducting as desired. Examples include Namics 119, well-known epoxies or the like. These so-called annular TSVs can be formed by carefully tailored plating by way of tightly controlled electric field generation during a plating process.

Figure 5:
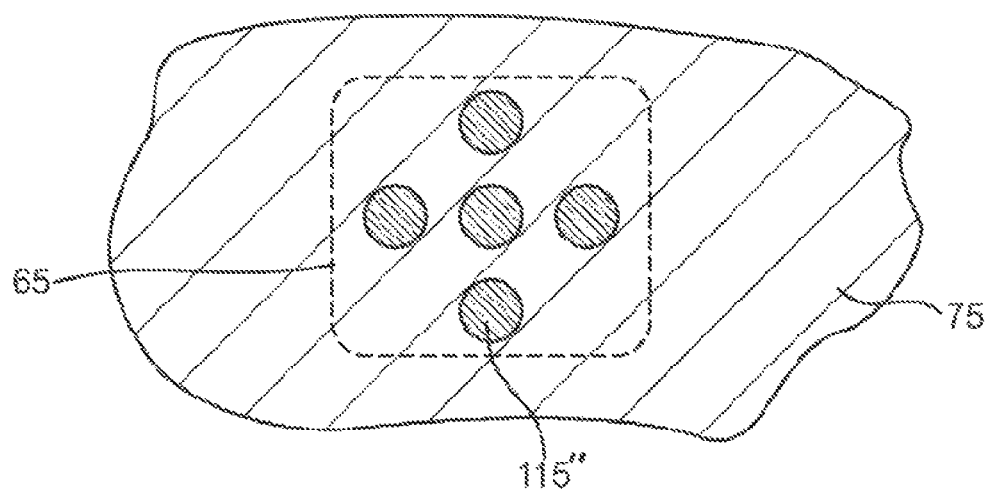
FIG. 5 is a sectional view like FIG. 3, but of an alternate exemplary embodiment in which multiple TSVs are connected to an underlying conductor pad.

As noted above, the arrangement of TSVs tied to a given conductor pad may be subject to great variation. In this regard, attention is now turned to FIG. 5, which is a sectional view like FIG. 3, but of an alternate exemplary embodiment where multiple TSVs 115" are connected to the underlying conductor pad 65, which is again shown in phantom due to its position beneath the metallization layer 75. Here, the TSVs 115" are arranged in a cross-like arrangement that does not necessarily match the somewhat rectangular footprint of the conductor pad 65. Again, a great variety of arrangements may be used and still achieve the technical benefits of multiple TSVs tied to a given conductor pad.

Figure 6:
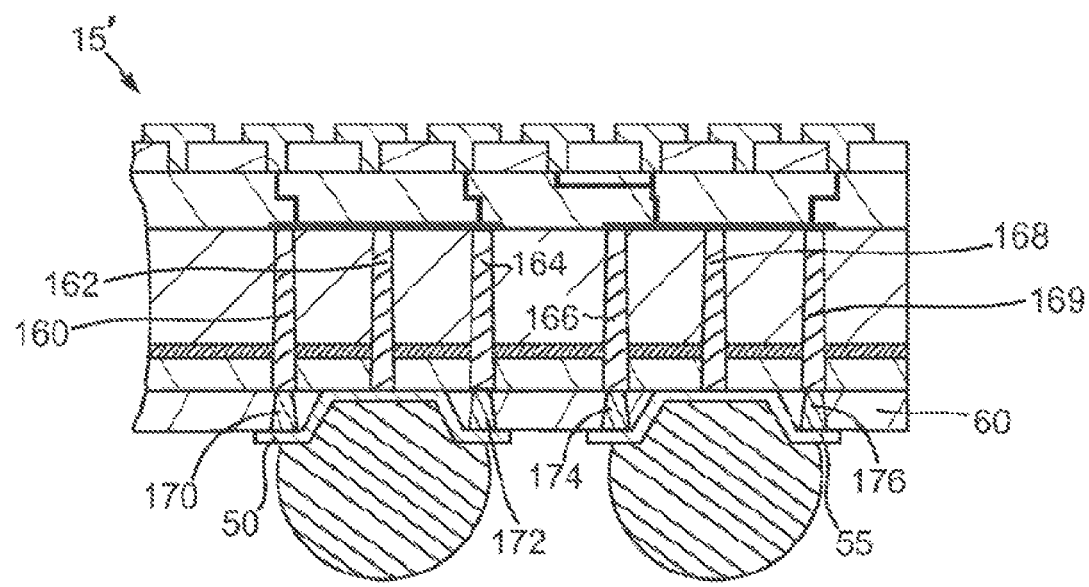
FIG. 6 is a sectional view like FIG. 2, but of an alternate exemplary embodiment of a semiconductor chip in which plural TSVs are multi-component.

In the foregoing illustrative embodiments, the various TSVs are fabricated as a continuous structure from top to bottom, that is, through the semiconductor device layer 85 and metallization layer 75 shown in FIG. 2. However, the skilled artisan will appreciate that multi-tiered structures could be used for TSVs. In this regard, attention is now turned to FIG. 6, which is a sectional view like FIG. 2, but of an alternate exemplary embodiment of a semiconductor chip 15', which may be configured substantially like the semiconductor chip 15 described elsewhere herein with a few notable exceptions. Here, plural TSVs 160, 162 and 164 may connect to the UBM structure 50 and plural TSVs 166, 168 and 169 may connect to the UBM structure 55. However, the TSVs 160 and 164 connect by way of respective TSV extensions 170 and 172 and the TSVs 166 and 169 connect by way of respective TSV extensions 174 and 176. Here, the TSV extensions 170, 172, 174 and 176 may be formed through the passivation structure 60.

Figure 7:
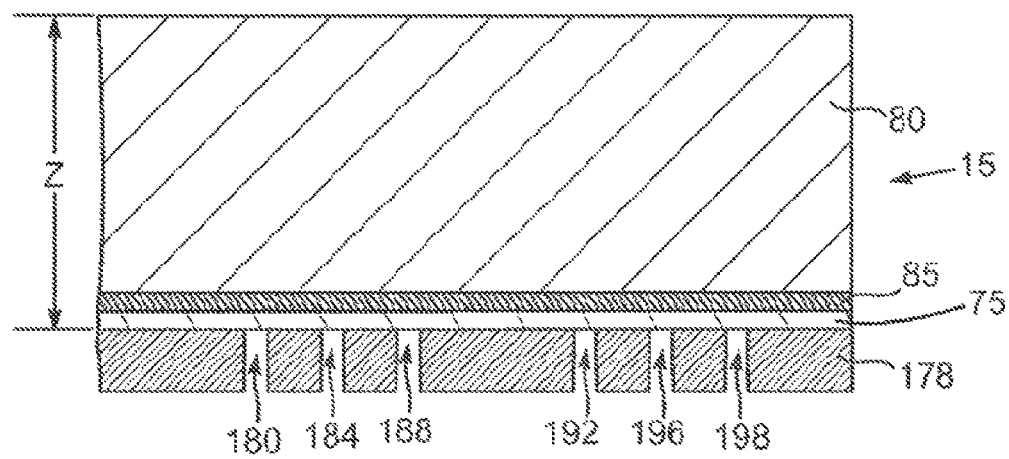
FIG. 7 is a sectional view of a semiconductor chip undergoing exemplary lithographic processing.

An exemplary process for forming the plural TSVs may be understood by referring now to FIGS. 7, 8, 9, 10, 11 and 12 and initially to FIG. 7, which is a sectional view of the semiconductor chip 15 at a preliminary stage of processing. At this stage, the device layer 85 has been fabricated using a multitude of well-known processing steps. The metallization layer 75 may also be fully or partially completed or not prior to TSV formation. At this point, the semiconductor chip 15 has a thickness Z, taken up primarily by the semiconductor layer 80, that is larger than the final thickness following the formation of the TSVs and the RDL 90 as shown in FIG. 2. At this point, a suitable lithography mask 178, may be applied to the device layer 85 and patterned lithographically to establish openings 180, 184, 188, 192, 196 and 198, which correspond to the desired locations for the subsequently formed TSVs 115, 120, 125, 130, 135 and 140. The mask 178 may be composed of well-known photoresist materials of either positive or negative tone Optionally, a non-contact or even a hard mask could be used.

Figure 8:
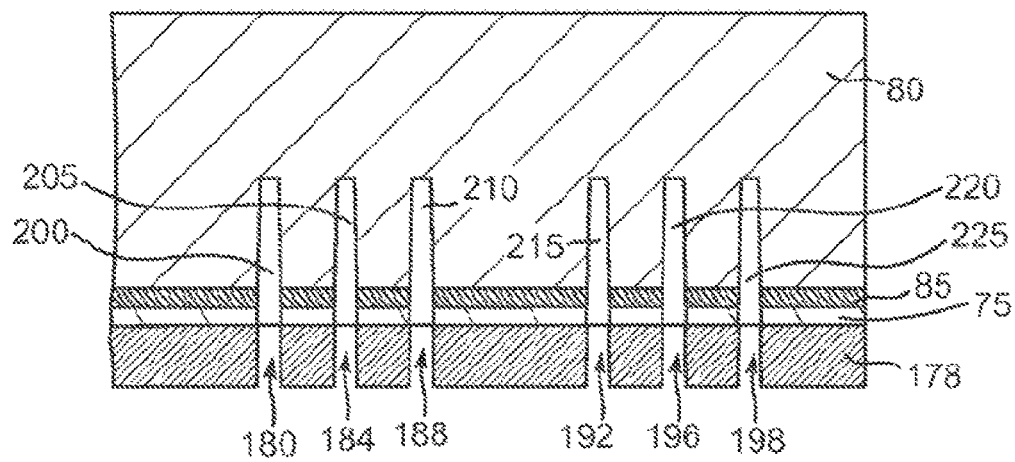
FIG. 8 is a sectional view like FIG. 7, but depicting exemplary formation of TSV trenches.
Figure 9:
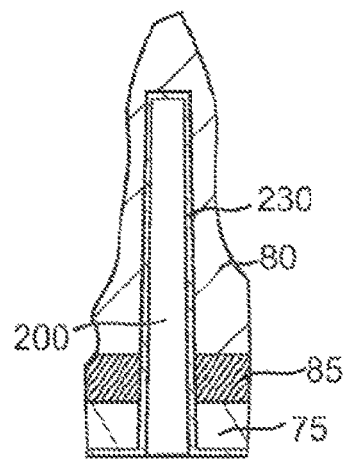
FIG. 9 shows a sectional view depicting a portion of FIG. at greater magnification.

Referring now to FIG. 8, following the patterning of the mask 178, a material removal process may be used to form deep trenches 200, 205, 210, 215, 220 and 225 in the semiconductor layer 80. The trenches 200, 205, 210, 215, 220 and 225 may be formed by chemical etching with or without plasma enhancement or other material removal techniques. It might be possible to use laser ablation although care should be exercised to avoid excessive thermal heating. Of course, the openings 180, 184, 188, 192, 196 and 198 in the mask 178 are patterned to have the desired footprint for the ultimately formed trenches 200, 205, 210, 215, 220 and 225. Depending upon the composition of the later-formed TSVs, it may be necessary to apply a liner film in the trenches 200, 205, 210, 215, 220 and 225 in order to facilitate both adhesion to the semiconductor layer 80 as well as prevent migration of atoms, molecules or larger portions of the TSVs into the semiconductor layer 80 and the device layer 85. FIG. 9 shows a sectional view of the trench 200 shown at greater magnification. A liner layer 230 may be formed in the trench 200 and coat not only the sidewalls of the trench 200 but also the sidewalls of the device layer 85. The liner layer 230 may be composed of a variety of materials, such as silicon dioxide. Well-known CVD techniques with or without plasma enhancement may be used to deposit the liner layer 230. The same may be done with regard to the other trenches 205, 210, 215, 220 and 225. The mask 178 shown in FIG. 8 may be removed before or after formation of the liner layer 230 by ashing, solvent stripping or the like, or lift of if a non-contact mask is used.

Figure 10:
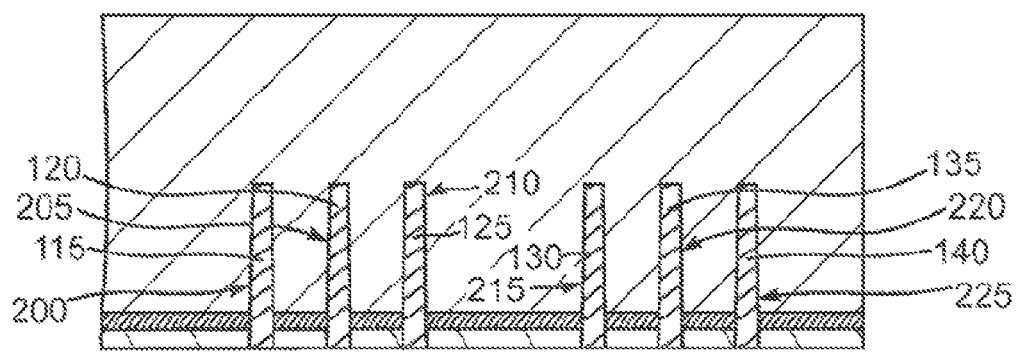
FIG. 10 is a sectional view like FIG. 8, but depicting exemplary TSV formation.

Following the removal of the etch mask 178 shown in FIGS. 7 and 8, the TSVs 115, 120, 125, 130, 135 and 140 may be formed in the respective trenches 200, 205, 210, 215, 220 and 225 as shown in FIG. 10. As noted elsewhere herein, the TSVs 115, 120, 125, 130, 135 and 140 may be formed in the respective trenches 200, 205, 210, 215, 220 and 225 as full formed columns or as annular TSVs as desired. The plating process may be a single step biased plating process or may be an unbiased seed layer plating process followed by a biased plating process as desired.

Figure 11:
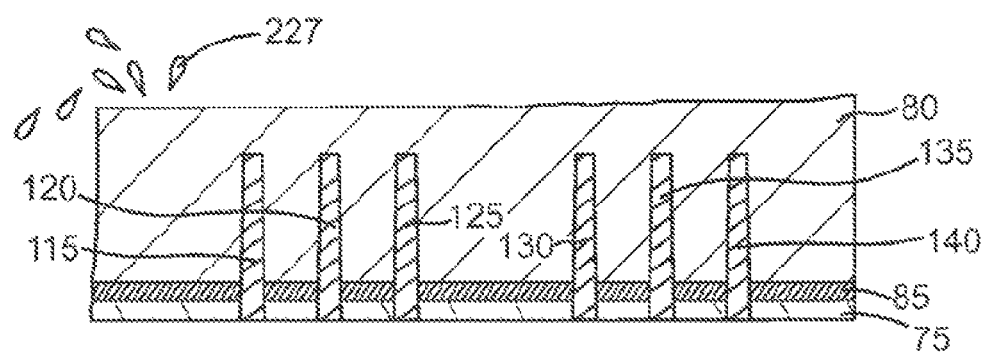
FIG. 11 is a sectional view like FIG. 10 depicting exemplary thinning of the semiconductor chip.
Figure 12:
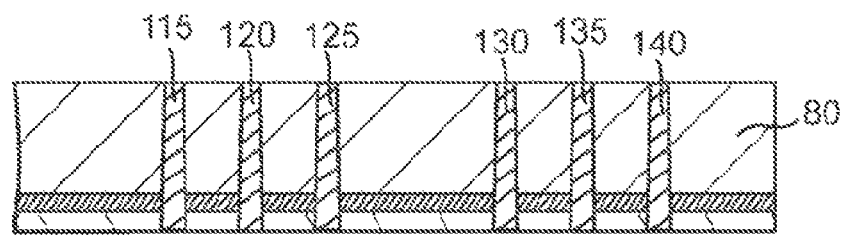
FIG. 12 is a sectional view like FIG. 11 depicting the semiconductor chip following thinning.
Figure 13:
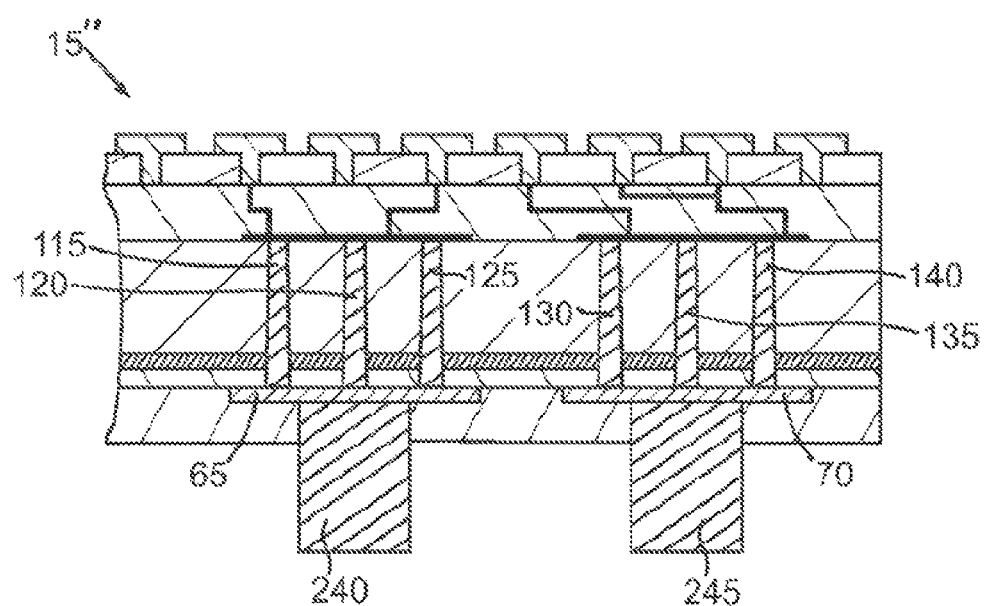
FIG. 13 is a sectional view like FIG. 2, but depicting an alternate exemplary semiconductor chip incorporating plural TSVs with conductive pillar input/outputs.

To enable the TSVs 115, 120, 125, 130, 135 and 140 to establish ohmic contact with structures in the later-formed RDL 90 shown in FIG. 2, the semiconductor layer 80 may be thinned as shown in FIG. 11. Here, portions 227 of the semiconductor layer 80 may be removed advantageously by chemical mechanical planarization (CMP), although other material removal techniques could be used in lieu of or in conjunction with CMP. With the TSVs 115, 120, 125, 130, 135 and 140 exposed as shown in FIG. 12, the RDL 90 depicted in FIG. 2 may be fabricated using well-known insulating material deposition and conductor material deposition and patterning techniques that may number over multiple layers depending upon the complexity of the RDL 90. Similarly, the fabrication of the passivation structure 95 and the interconnect structures 110 may follow the formation of the RDL 90.

Referring again to FIG. 1, the semiconductor chip 25 may be stacked on the semiconductor chip 15 and electrically connected thereto by solder reflow, compression bonding or other techniques depending on the type of chip-to-chip interface used. The skilled artisan will appreciate that the semiconductor chip 25 could be stacked on the semiconductor chip 15 at the wafer level or die level as desired. The semiconductor chips 15 and 25, may be mounted to the circuit board 20, singly or en masse.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Cadence Spectra, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus comprising:
a first semiconductor chip including a first conductor pad;
a first plurality of conductive vias traversing one or more layers of the first semiconductor chip, each of the first plurality of conductive vias including a first end, a second end, a polymer core and conductor jacket around the polymer core, the first ends of two or more first conductive vias of the first plurality of conductive vias in contact with the first conductor pad; and
a redistribution layer structure formed on a last layer of the one or more layers, the redistribution layer structure in contact with the second ends of the first plurality of conductive vias.

2. The apparatus of claim 1, comprising a conductive via extension on each of the first ends of one or more second conductive vias of the first plurality of conductive vias and in contact with the first conductor pad.

3. The apparatus of claim 1, wherein the first semiconductor chip comprises a second conductor pad and a second plurality of conductive vias traversing the one or more layers and having third ends and fourth ends, the third ends in contact with the second conductor pad.

4. The apparatus of claim 1, comprising a solder bump or a conductive pillar coupled to the first conductor pad.

5. The apparatus of claim 1, comprising a second semiconductor chip stacked on the first semiconductor chip.

6. The apparatus of claim 1, comprising a circuit board coupled to the first semiconductor chip.

7. The apparatus of claim 1, wherein the last layer is a bulk semiconductor layer.

8. The apparatus of claim 7, wherein the one or more layers further includes a metallization layer and a device layer between the metallization layer and the bulk semiconductor layer.

9. The apparatus of claim 1, wherein the two or more first conductive vias of the first plurality of conductive vias includes four or more conductive vias arranged in a cross-like arrangement.

10. A semiconductor package comprising:
a substrate; and
a first semiconductor chip coupled to the substrate, the first semiconductor chip including:
a first conductor pad;
a first plurality of conductive vias traversing one or more layers of the first semiconductor chip, each of the first plurality of conductive vias including a first end, a second end, a polymer core and conductor jacket around the polymer core, the first ends of two or more first conductive vias of the first plurality of conductive vias in contact with the first conductor pad; and
a redistribution layer structure formed on a last layer of the one or more layers, the redistribution layer structure in contact with the second ends of the first plurality of conductive vias.

11. The semiconductor package of claim 10, comprising a conductive via extension on each of the first ends of one or more second conductive vias of the first plurality of conductive vias and in contact with the first conductor pad.

12. The semiconductor package of claim 10, wherein the first semiconductor chip comprises a second conductor pad and a second plurality of conductive vias traversing the one or more layers and having third ends and fourth ends, the third ends in contact with the second conductor pad.

13. The semiconductor package of claim 10, comprising a solder bump or a conductive pillar coupled to the first conductor pad.

14. The semiconductor package of claim 10, comprising a second semiconductor chip stacked on the first semiconductor chip.

15. The semiconductor package of claim 10, comprising a circuit board coupled to the first semiconductor chip.

16. The semiconductor package of claim 10, wherein the last layer is a bulk semiconductor layer.

17. The semiconductor package of claim 16, wherein the one or more layers further includes a metallization layer and a device layer between the metallization layer and the bulk semiconductor layer.

18. The semiconductor package of claim 10, wherein the two or more first conductive vias of the first plurality of conductive vias includes four or more conductive vias arranged in a cross-like arrangement.

19. A method of manufacturing a semiconductor chip package, comprising:
fabricating a first semiconductor chip including a first conductor pad;
fabricating a first plurality of conductive vias traversing one or more layers of the first semiconductor chip, each of the first plurality of conductive vias including a first end, a second end, a polymer core and conductor jacket around the polymer core, wherein the first ends of two or more first conductive vias of the first plurality of conductive vias are in contact with the first conductor pad; and
fabricating a redistribution layer structure on a last layer of the one or more layers, wherein the redistribution layer structure is in contact with the second ends of the first plurality of conductive vias.

20. The method of claim 19, further comprising fabricating a conductive via extension on each of the first ends of one or more second conductive vias of the first plurality of conductive vias, wherein the conductive via extension contacts the first conductor pad.

* * * * *